United States Patent
Crippa

(10) Patent No.: US 12,032,003 B2
(45) Date of Patent: Jul. 9, 2024

(54) PROBE HEAD FOR ELECTRONIC DEVICES AND CORRESPONDING PROBE CARD

(71) Applicant: Technoprobe, S.p.A., Cernusco Lombardone (IT)

(72) Inventor: Roberto Crippa, Cernusco Lombardone LC (IT)

(73) Assignee: Technoprobe, S.p.A., Cernusco Lombardone (IT)

( * ) Notice: Subject to any disclaimer, the term of this patent is extended or adjusted under 35 U.S.C. 154(b) by 215 days.

(21) Appl. No.: 17/591,363

(22) Filed: Feb. 2, 2022

(65) Prior Publication Data
US 2022/0155348 A1    May 19, 2022

Related U.S. Application Data

(63) Continuation-in-part of application No. PCT/EP2020/071893, filed on Aug. 4, 2020.

(30) Foreign Application Priority Data

Aug. 7, 2019    (IT) .................. 102019000014208

(51) Int. Cl.
*G01R 1/073*    (2006.01)
*G01R 1/067*    (2006.01)

(52) U.S. Cl.
CPC ..... *G01R 1/07357* (2013.01); *G01R 1/06738* (2013.01); *G01R 1/07378* (2013.01)

(58) Field of Classification Search
CPC ........... G01R 1/07357; G01R 1/06738; G01R 1/07378; G01R 1/07371; G01R 31/2886; G01R 1/07314; G01R 31/2808
See application file for complete search history.

(56) References Cited

U.S. PATENT DOCUMENTS 6,150,830 A    11/2000 Schmid et al.
6,300,783 B1 *  10/2001 Okubo ............... G01R 1/07357
                                                         324/755.06
(Continued)

FOREIGN PATENT DOCUMENTS

EP    3715866    9/2020
GB    2086670    5/1982
(Continued)

OTHER PUBLICATIONS

International Search Report, PCT/EP2020/071893, mailed on Oct. 26, 2020.

*Primary Examiner* — Akm Zakaria
(74) *Attorney, Agent, or Firm* — Greenberg Traurig

(57) ABSTRACT

A probe head for a test equipment of electronic devices comprises a plurality of contact probes inserted in guide holes provided in at least one upper guide and one lower guide, a bending area for the contact probes being defined between the upper and lower guides, each contact probe having at least one first terminal portion which protrudes of a first length from the lower guide and ends with a contact tip (22A) adapted to abut onto a respective contact pad of a device to be tested, as well as a second terminal portion which protrudes of a second length from the upper guide and ends with a contact head adapted to abut onto a contact pad of a board for connecting or interfacing with the test equipment, suitably comprising at least one protection structure projecting from the upper guide in direction of a longitudinal development axis of the contact probes towards the board, the protection structure thus extending in correspondence of the contact heads of the contact probes.

9 Claims, 14 Drawing Sheets

(56) References Cited

U.S. PATENT DOCUMENTS

| | | | | |
|---|---|---|---|---|
| 2003/0128041 | A1* | 7/2003 | Byrd | G01R 3/00 |
| | | | | 324/750.05 |
| 2008/0054919 | A1* | 3/2008 | Wu | G01R 1/07357 |
| | | | | 324/750.21 |
| 2008/0238408 | A1 | 10/2008 | Mcquade | |
| 2013/0265074 | A1 | 10/2013 | Sato | |
| 2015/0061719 | A1* | 3/2015 | Lee | G01R 1/07378 |
| | | | | 324/756.03 |
| 2018/0052190 | A1* | 2/2018 | Perego | G01R 1/06733 |
| 2019/0113539 | A1 | 4/2019 | Crippa et al. | |

FOREIGN PATENT DOCUMENTS

| | | |
|---|---|---|
| JP | 2015025749 | 2/2015 |
| JP | 2018179721 | 11/2018 |
| WO | 2018019866 | 2/2018 |

* cited by examiner

PROBE HEAD FOR ELECTRONIC DEVICES AND CORRESPONDING PROBE CARD

RELATED APPLICATIONS

The present application is a Continuation-in-Part (CIP) application of Int. Pat. App. No. PCT/EP2020/071893, filed Aug. 4, 2020 and entitled "Probe head for electronic devices and corresponding probe card," which claims priority to Italian Pat. App. No. 102019000014208, filed Aug. 7, 2019, the entire disclosures of which applications are hereby incorporated herein by reference.

TECHNICAL FIELD

The present disclosure refers to a probe head for a test equipment of electronic devices.

The disclosure relates in particular, but not exclusively, to a probe head with vertical probes for testing electronic devices, in particular integrated on a semiconductor wafer and the following description is made with reference to this field of application with the sole purpose of simplifying the presentation thereof.

DESCRIPTION OF THE RELATED ART

As is well known, a probe head is essentially a device adapted to electrically connect a plurality of contact pads of a microstructure, in particular an electronic device integrated on a wafer, with corresponding channels of a test equipment which verifies the functionality thereof, in particular the electrical one.

The test carried out on integrated devices is used to detect and isolate defective devices already in the production phase. Normally, the probe heads are then used for the electrical test of the devices integrated on the wafer before cutting and mounting them inside a chip containment package.

A probe head comprises a plurality of movable contact elements or contact probes held by at least one plate, usually a pair of plates or guides that are substantially plate-like and parallel to each other and placed at a certain distance between them so as to leave a free area or air area for the movement and possible deformation of the contact probes. The pair of guides includes in particular an upper guide, usually indicated with the term "upper die", and a lower guide, usually indicated with the term "lower die", the adjectives "upper" and "lower" being used in the sector with reference to a probe head during its operation and corresponding to the illustrations of the figures, the head being positioned between the test equipment (above) and the semiconductor wafer comprising the devices to be tested (below). In other words, the upper guide is the one that is positioned the closest to the test equipment and the lower guide is the one that is positioned the closest to the wafer of devices to be tested.

The guides are both provided with guide holes in which the contact probes slide axially, normally formed by special alloy wires with good electrical and mechanical properties.

The probe head is also completed by a case arranged between the upper and lower guides, normally made of ceramic and adapted to contain and protect the probes.

The good connection between the contact probes and respective contact pads of the device to be tested is ensured by the pressure of the probe head on the device itself, that is on the wafer that comprises it, the contact probes, movable within the guide holes made in the upper and lower guides, undergoing in case of said pressing contact a bending inside the air area between the guides and a sliding inside the guide holes.

Probe heads of this type are commonly indicated with the term "vertical probe head".

The vertical probe heads essentially have an air area in which a bending of the contact probes takes place, and is therefore also indicated as a bending area; furthermore, the bending of the contact probes can be assisted through a suitable configuration of the probes themselves and/or thanks to a suitable relative positioning or phase shift of the guides.

In some cases, the contact probes are connected to the probe head at the upper guide in a fixed manner, for example by welding or bonding: they are called probe heads with blocked probes.

More frequently, however, probe heads are used with probes not connected in a fixed manner, but kept interfaced with a spatial transformation board, commonly referred to as a "space transformer" which is part of a probe card including the probe head and connected to the test equipment: they are called probe heads with non-blocked probes. In general, the probe head is however interfaced and connected to a PCB of the probe card which comprises it, so as to interface with the test equipment of which the probe card is a terminal element.

A probe card comprising a probe head with non-blocked vertical probes is schematically in FIG. 1, where for simplicity's sake of illustration only one contact probe of the plurality of probes normally included in such a probe head has been shown.

In particular, the probe card 10 comprises the probe head 1 and a PCB for connecting and interfacing with the test equipment, such as a space transformer 8; the probe head in turn includes at least an upper guide 3 and a lower guide 4, made by substantially flat and parallel plate-like supports and having respective upper guide holes 3A and lower guide holes 4A within which respective contact probes 2 slide. In FIG. 1, the probe card 10 is illustrated in operating conditions, with the probe head 1 resting on a wafer comprising at least one device to be tested 7.

The probe head 1 also comprises a case 4, which also acts as a stiffener, arranged between the upper and lower guides, 3 and 4, so as to contain and protect the contact probes 2. The case 4 extends in particular at an air or bending area 6 between said guides.

Each contact probe 2 has a substantially rod-like body 2C and at least one contact end or tip 2A. The term end or tip indicates herein and in the following a portion of the end, not necessarily pointed. In particular, the contact tip 2A abuts onto a contact pad 7A of the device to be tested 7, making the mechanical and electrical contact between said device and a test equipment (not shown) of which the probe card 10 is a terminal element.

In the example illustrated in FIG. 1, the contact probe 2 has a further contact end, usually indicated as contact head 2B, towards a plurality of contact pads 8A of the space transformer 8. The good electrical contact between probes and space transformer is ensured in a similar way to the contact with the device to be tested by pressure of the end portions, in particular of the head, of the contact probes onto the respective contact pads.

More generally, as indicated above, the contact pads with the contact heads of the probes can be made on a PCB for connecting or interfacing with the test equipment used for the connection with the probe card which comprises the probe head, the considerations made previously being valid also for said PCB.

The upper guide 3 and the lower guide 4 are suitably spaced from the air or bending area 6 which allows the deformation of the contact probes 2, the upper guide holes 3A and the lower guide holes 4A being sized so as to allow a sliding of a respective contact probe inside them. A further area 9, called the floating area, is defined between the upper guide 3 and the space transformer 8; said floating area 9 is established so that a movement of the contact heads 2B in case of the pressing contact of the probe head 1 and therefore of the contact probes 2 on the device to be tested 7 is guaranteed, that is of the contact tips 2A on the relative contact pads 7A, ensuring in any case the contact of the contact heads 2B with the contact pads 8A of the space transformer 8.

In the case of a probe head made with the so-called "shifted plate" technology, the upper guide 3 and the lower guide 4 are also offset or shifted in a direction Dshift, being parallel to their development plane, indicated in the figure with $\pi$, and the contact probes 2, also referred to as the "buckling beam", therefore have a suitably deformed probe body, in a substantially central position, as illustrated in FIG. 1, so as to allow the correct holding of the probe in the guide holes of the upper and lower guides and forcing a privileged bending direction of the same, substantially corresponding to the direction Dshift.

It should be remembered that the correct operation of a probe head and therefore of the probe card which comprises it is fundamentally linked to two parameters: the vertical displacement, or overtravel, of the contact probes and the horizontal displacement, or scrub, of the respective contact ends, in particular the contact tips 2A, on the contact pads 7A of the device to be tested 7, capable of obtaining a surface "cleaning" of said pads, thus improving the contact made by the probe head 1, that is by its contact probes 2, for its entire useful life.

It is also important to ensure that the floating area 9 of the contact heads 2B of the contact probes 2 is sized so as to ensure the correct housing of said contact heads 2B in the probe head, in addition to the correct mechanical and electrical contact of the same on the contact pads 8A of the space transformer 8.

All these characteristics are to be evaluated and calibrated during the realization of a probe head, the good electrical connection between probes, device to be tested and test equipment, always having to be guaranteed.

The ends of the contact probes, in particular the tips contacting the pads of the devices to be tested, are subject to accumulation of material, generally referred to as dirt, during use, which decreases the performance thereof and risks compromising the correct contact of the probes with the device to be tested, when the scrub of said tips is not however able to ensure the electrical contact with the pads.

It is therefore known to perform periodic cleaning operations of the probe heads, in particular of the contact tips of their probes by means of abrasive cloths.

Said cleaning operations however involve the consumption of a part of the end portion of the probes, in particular of the contact tip, and are therefore limited in number precisely by the length of said tip, which is shortened with each cleaning. Any subsequent abrasion of the end portion of contact tip must in particular be limited to the portion of the tapered probe which protrudes from the lower guide, which precisely provides the contact tip.

The number of cleaning operations of the probe head actually determines its useful life and consequently the useful life of the probe card that contains it.

It is known from the international patent application (PCT) published on 16 Oct. 2014 with No. WO 2014/167410 in the name of the same Applicant, the use of a spacer element, interposed in a removable manner between the containment element and one of the upper and lower guides, so as to adjust the length of the end portions of the contact probes, in particular, at the contact points.

Said probe head, although advantageous in various respects, has a drawback linked to the fact that the variation in length of the end portions effected by removing the spacer or a layer thereof inevitably also changes the air or bending area of the contact probes thus modifying the contact dynamics and introducing problems in terms of force exerted by the probes on the contact pads and also of scrub that can be provided on them, in addition to modifying the deformation suffered by the probes in said air area, with the risk of permanent deformations or interlocking of said probes in the respective guide holes.

It is also immediate verifiable how measures aimed at modifying the length of the contact probe that projects from the probe head, in particular at its tip end portion towards the device to be tested, often also involve undesired changes in the floating area at the head end portion of the probes, compromising their connection with the PCB towards the test equipment, even bringing an incorrect operation of the probe head as a whole.

BRIEF SUMMARY

The probe head of electronic devices integrated on a wafer is able to guarantee a correct housing of the contact probes inside it also following cleaning operations of the contact probes without functional loss, overcoming the limitations and drawbacks that still afflict the probe heads made according to the prior art, in particular ensuring an adequate protection and correct holding of the contact heads of the probes within the floating area, a correct sliding of the probes in the respective guide holes and essential scrub mechanisms for a correct contact between probes and contact pad of the device to be tested and the PCB connected to the test equipment throughout the life of the probe head and the probe card which comprises it, even after a plurality of cleaning operations.

According to an aspect of the disclosure suitable protection structures within the probe head for the contact head portions of its probes are provided, such protection structures being also positioned so as not to interfere with the normal operation of the probe head and being preferably removable, possibly provided by means of individually removable layers so as to modify the extension of the floating area and consequently the length of the probes protruding from the probe head towards the device to be tested after cleaning operations that have reduced the length thereof at the contact tip portion, without however changing the length of the bending area of the probes.

The probe head for a test equipment of electronic devices comprises a plurality of contact probes inserted in guide holes provided in at least one upper guide and one lower guide, a bending area for the contact probes being defined between the upper and lower guides, each of said contact probes having at least one first terminal portion which protrudes of a first length from the lower guide and ends with a contact tip adapted to abut onto a respective contact pad of a device to be tested, as well as a second terminal portion which protrudes of a second length from the upper guide and ends with a contact head adapted to abut onto a contact pad of a PCB for connecting or interfacing with the test equipment, characterized in that it comprises at least one protection structure projecting from said upper guide in direction of a longitudinal development axis of the contact probes towards the PCB, said protection structure thus extending at the contact heads of the contact probes.

According to another aspect of the disclosure, the protection structure can be fastened, possibly in a removable way, to the upper guide.

In particular, the protection structure can be fastened to the upper guide by means of an adhesive glue layer, a welding or fastening means selected from screws or clips, which at least partially cross the protection surface and the upper guide.

According to another aspect of the disclosure, the protection structure can be provided by projecting portions of the upper guide in the direction of the longitudinal development axis of the contact probes towards the PCB.

According to yet another aspect of the disclosure, the protection structure can comprise a plurality of individually detachable layers which are stacked one upon another between the PCB and the upper guide.

In particular, the protection structure can comprise an adhesive material, preferably a glue with low seal, or removable coupling means adapted to make the layers integral with each other.

According to another aspect of the disclosure, the protection structure can have a shape selected from a frame, pairs of half-frames, single projecting elements such as pillars.

Furthermore, according to another aspect of the disclosure, the protection structure and possibly layers thereof can be provided so as to protrude with respect to the upper guide and/or the PCB.

The protection structure and possibly layers thereof can also be made of transparent or semitransparent plastic material, or ceramic material, or metallic material or organic material or silicon, preferably of Kapton®.

According to another aspect of the disclosure, the probe head can comprise an upper guide and/or a lower guide including a pair of elementary supports and provided with a spacer structure positioned between the elementary supports.

According to said aspect of the disclosure, the spacer structure can be fastened, possibly in a removable manner, to one of the elementary supports, or it is provided by projecting portions thereof, or it comprises a plurality of overlapping and individually removable layers.

According to another aspect of the disclosure, the protection structure can have a height equal or preferably greater than one of the greatest among all heights of enlarged portions of the contact heads of the contact probes.

Alternatively, the protection structure can have a height equal or preferably greater than one of the greatest among all heights of tapered portions of the contact heads of the contact probes.

The technical problem is also solved by a probe card for a test equipment of electronic devices comprising at least one probe head and at least one PCB for connecting and interfacing with the test equipment, the probe head being provided with a plurality of contact probes adapted to abut onto a plurality of contact pad of the space transformer, characterized in that the probe head is provided as indicated above.

According to another aspect of the disclosure, the probe card can further comprise holding means adapted to make the guides and/or elementary supports of the probe head, the protection structure and/or the spacer structures, being provided with suitable housing seats for the holding means, integral.

The characteristics and advantages of the probe head according to the disclosure will become clear from the description, made below, of an example of its embodiment given by way of non-limiting example with reference to the attached drawings.

DETAILED DESCRIPTION

Figure 1:
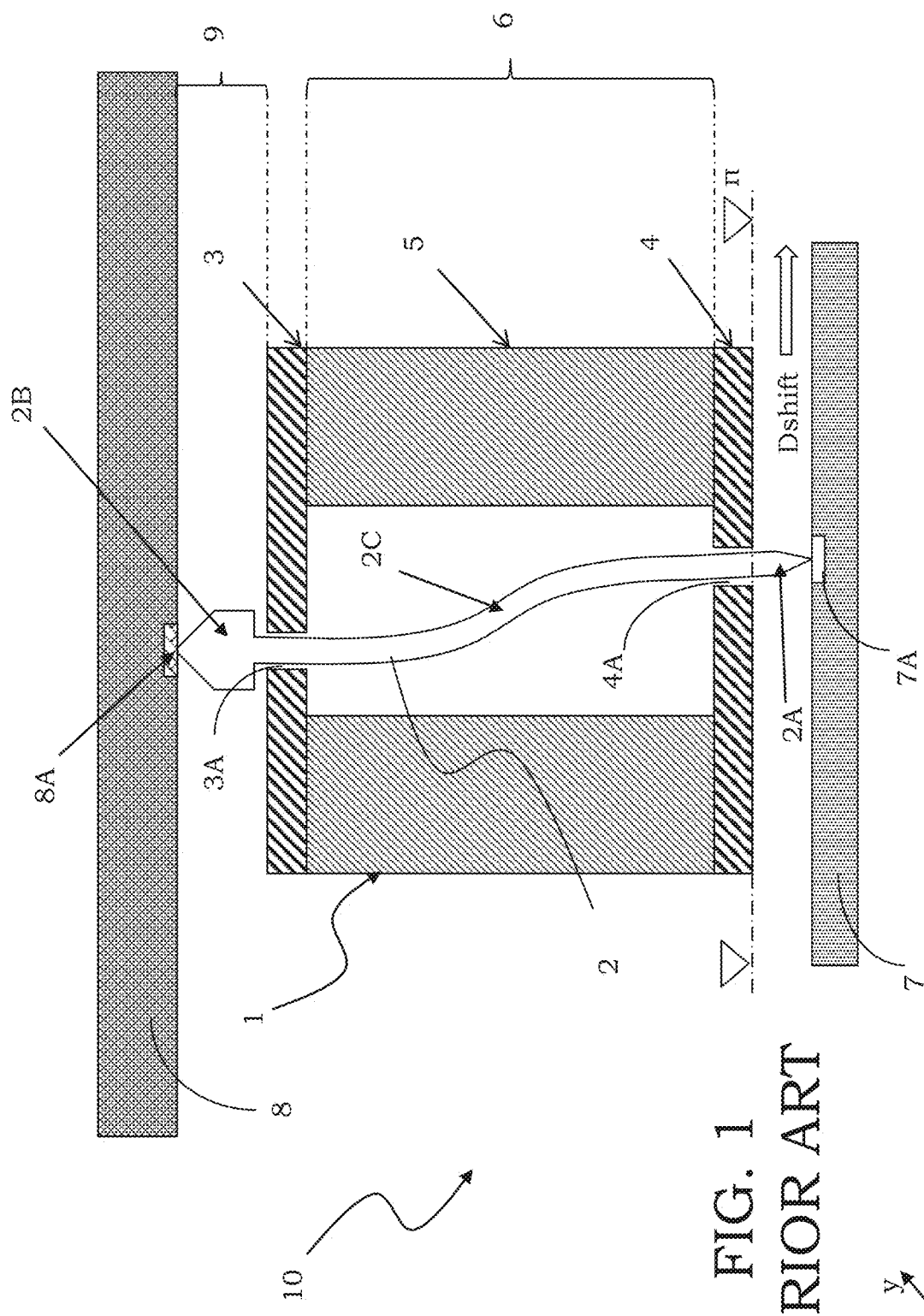
FIG. 1: schematically shows a probe card of electronic devices, in particular integrated on wafer, provided according to the prior art.
Figure 2:
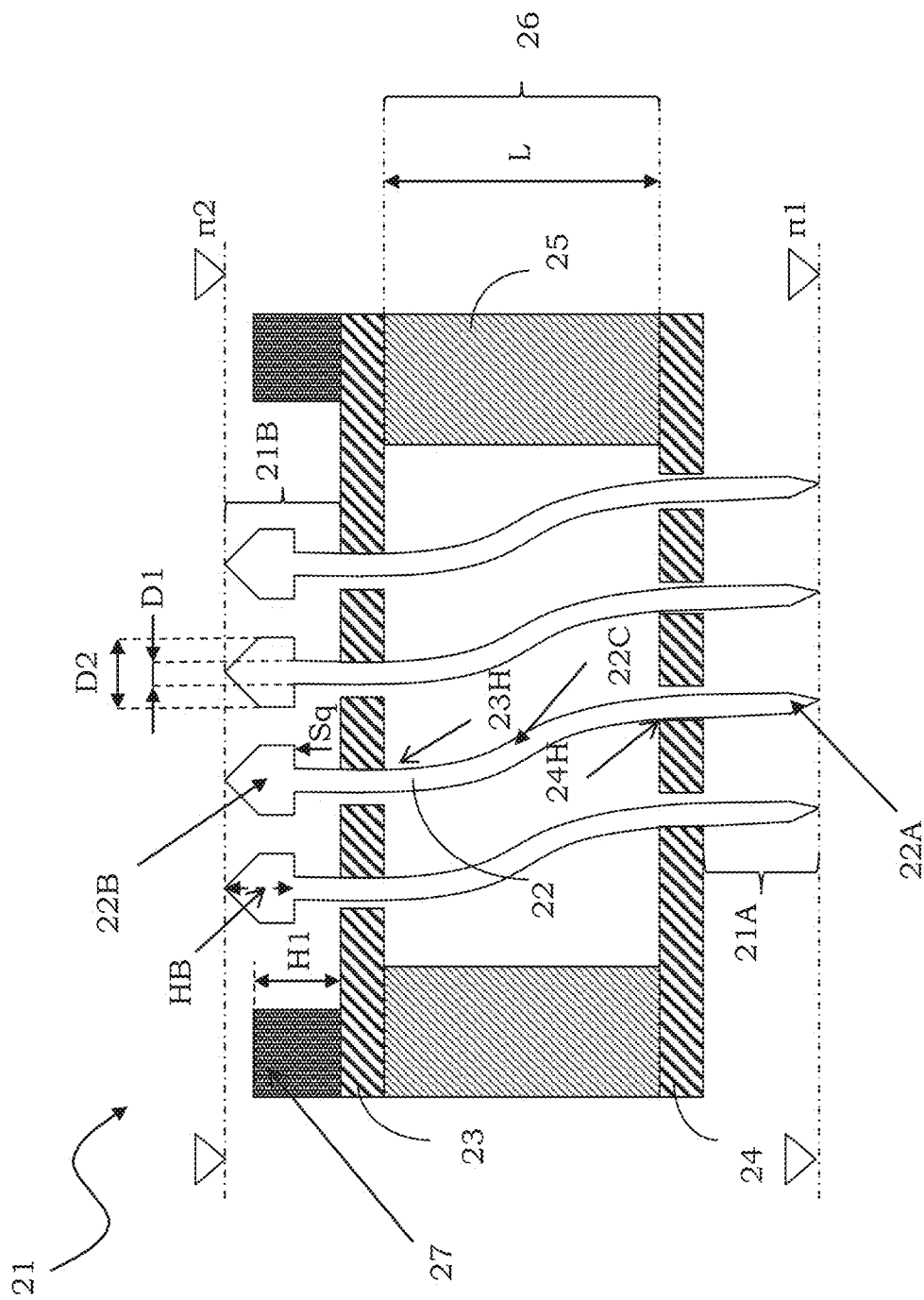
FIG. 2: schematically shows a section view of a probe head, provided according to an embodiment of the disclosure.

With reference to these figures, and in particular to FIG. 2, a probe head according to the disclosure is globally indicated with 21.

It should be noted that the figures represent schematic views and are not drawn to scale, but are instead drawn in such a way as to emphasize the important features of the disclosure. It is further pointed out that measures shown with reference to a particular embodiment can obviously be used in combination with other embodiments. Finally, the same numeral references are used in the different figures to indicate structurally and functionally corresponding elements.

The probe head 21 includes a plurality of contact probes 22 housed in suitable guide holes of respective supports or an upper guide 23 and a lower guide 24, that are plate-like and parallel. The probe head 21 also comprises a containment element or case 25 extended between the upper guide 23 and the lower guide 24, at an air area or bending area 26, having a height indicated with L, where the contact probes 22 can be further deformed in case of the pressing contact of the probes on a device to be tested, usually contained in a semiconductor wafer, onto which the probe head 21 abuts, at a first plane indicated in the figure with $\pi 1$.

In particular, the probe head 21 illustrated in FIG. 2 is of the non-blocked vertical probe type and the contact probes 22 each have respective terminal portions 21A and 21B adapted to make a mechanical and electrical contact with respective contact pads; in particular a first terminal portion 21A ends with a contact tip 22A adapted to abut onto a contact pad of the device to be tested at the first plane $\pi 1$, whereas a second terminal portion 21B ends with a contact head 22B adapted to abut onto a further contact pad of a connection element towards a test equipment, such as a layer of spatial transformation or space transformer or a generic connection or interface PCB, at a second plane indicated in the figure with 72. In this way, the contact probes 22 provide for the mechanical and electrical contact between the device to be tested and a test equipment (not shown) of which the probe head 21 is a terminal element. The contact probes 22 also have a substantially rod-like probe body 22C extended between said first and second end portions, 21A and 21B.

The term "terminal portion" means a part of the contact probes 22 which protrudes with respect to the guides and therefore to the case 25, in particular in the direction of the device to be tested or of the PCB of the probe card which comprises the probe head 21, respectively. Furthermore, like previously pointed out, the term tip indicates an end portion, not necessarily pointed.

In particular, the first terminal portion 21A of the contact probes 22 at the contact tip 22A extends below the lower guide 24 of the probe head 21, in the direction opposite to the longitudinal development axis of the probe indicated with z in the local reference of the figure. Likewise, the second terminal portion 21B of the contact probes 22 at the contact head 22A extends above the upper guide 23 of the probe head 21, in the direction of the longitudinal development axis z.

As previously described, the contact probes 22 have a first terminal portion 21A comprising the contact tip 22A having a tapered shape so as to make a substantially point-like contact on the contact pads of the device to be tested. Furthermore, the contact probes 22 have a second terminal portion 21B comprising the contact head 22B provided with at least one enlarged portion, that is, having a transverse diameter D2 of greater dimensions than a transverse diameter D1 of the rest of the second terminal portion 21B and in general of the probe body 22C, whereby diameter refers to a maximum transverse dimension of a section of said portion orthogonal to a longitudinal development axis z of the contact probe 22; the contact head 22B is further tapered so as to make a substantially point-like contact on the pads of the PCB of the probe card which comprises the probe head 21. The contact head 22B, thanks to its enlarged portion, also has respective undercut walls adapted to rest on the upper guide 23, realizing the desired holding of the contact probe 22 inside the probe head 21 even in the event of no contact of said probe head 21 with a device to be tested.

Precisely the presence of such an enlarged portion at the contact head 22B of the contact probes 22 increases the problems tied to the correct containment and freedom of movement of the contact probes 22 inside the probe head 21. As already explained, during the operation of said probe head 21, i.e. in case of a test operation of a device integrated on a semiconductor wafer, the contact probes 22 undergo a bending and a deformation when their contact tips 22A abuts onto the pads of the device to be tested and their contact heads 22B abut onto corresponding contact pads of a PCB or of a space transformer of the probe card which comprises said probe head 21; during said contact, the contact probes 22 but also the entire probe head 21 are substantially pushed up, that is towards the test equipment, according to the direction of the longitudinal development axis z in the figure.

Suitably, the probe head 21 according to an embodiment of the present disclosure therefore comprises at least one protection structure 27 projecting from the upper guide 23 in the direction of the test equipment, that is in the direction of the longitudinal development axis z indicated in the figure. The protection structure 27 therefore extends at the contact heads 22B, which protrude from the upper guide 23 precisely according to the direction of the longitudinal development axis z.

In particular, the protection structure 27 has a height H1 equal or preferably greater than a corresponding height HB (H1≥HB) of the contact heads 22B starting from their enlarged portions up to the substantially point-like end of real contact. More specifically, the height HB of each individual contact head 22B is measured from the undercut walls Sq, i.e. from the section of maximum diameter, to the tapered end that forms the real contact area, i.e. the section of minimum diameter, substantially point-like. Furthermore, the height H1 of the protection structure 27 is selected so as to be equal or preferably greater than the greatest among all heights of the contact heads 22B of the contact probes 22; in this way the protection structure 27 is able to correctly protect all the contact heads 22B of the contact probes 22 of the probe head 21.

It is pointed out that, although not illustrated in the figures, the probe head 21 can also comprise contact probes 22 with second terminal portions 21B provided with non-enlarged contact heads 22B. In this case, the protection structure 27 is used to avoid an excessive approach of the contact heads 22B, in particular of the real area of contact with the upper guide 23, which approach might cause an interlocking of the contact heads 22B in the respective upper guide holes 23H, with consequent malfunction of the probe head 21 as a whole, in particular due to the lack of contact with the PCB for connecting and interfacing with the test equipment. In this case, the height H1 of the protection structure 27 is selected so as to be greater than a tapered portion of the second terminal portion 21B which forms the contact head 22B or in any case such as to avoid an interlocking of the contact head 22B in the corresponding upper guide hole 23H which houses it in the upper guide 23; also in this case, the height H1 of the protection structure 27 is determined so as to be equal or preferably greater than one of the greatest among all heights of tapered portions of the contact heads 22B of the contact probes 22.

The protection structure 27 is fastened in a more or less removable manner to the upper guide 23, for example by means of an adhesive glue layer, by welding or with fastening means such as screws or clips, which at least partially cross the protection surface 27 and the upper guide 23.

Such a protection structure 27 can be substantially shaped as a frame or comprise one or more portions, at areas of the upper guide 23 not crossed by guide holes and therefore by the contact probes 22, all projecting from the upper guide 23 in the direction of the longitudinal development axis z.

Figure 3A:
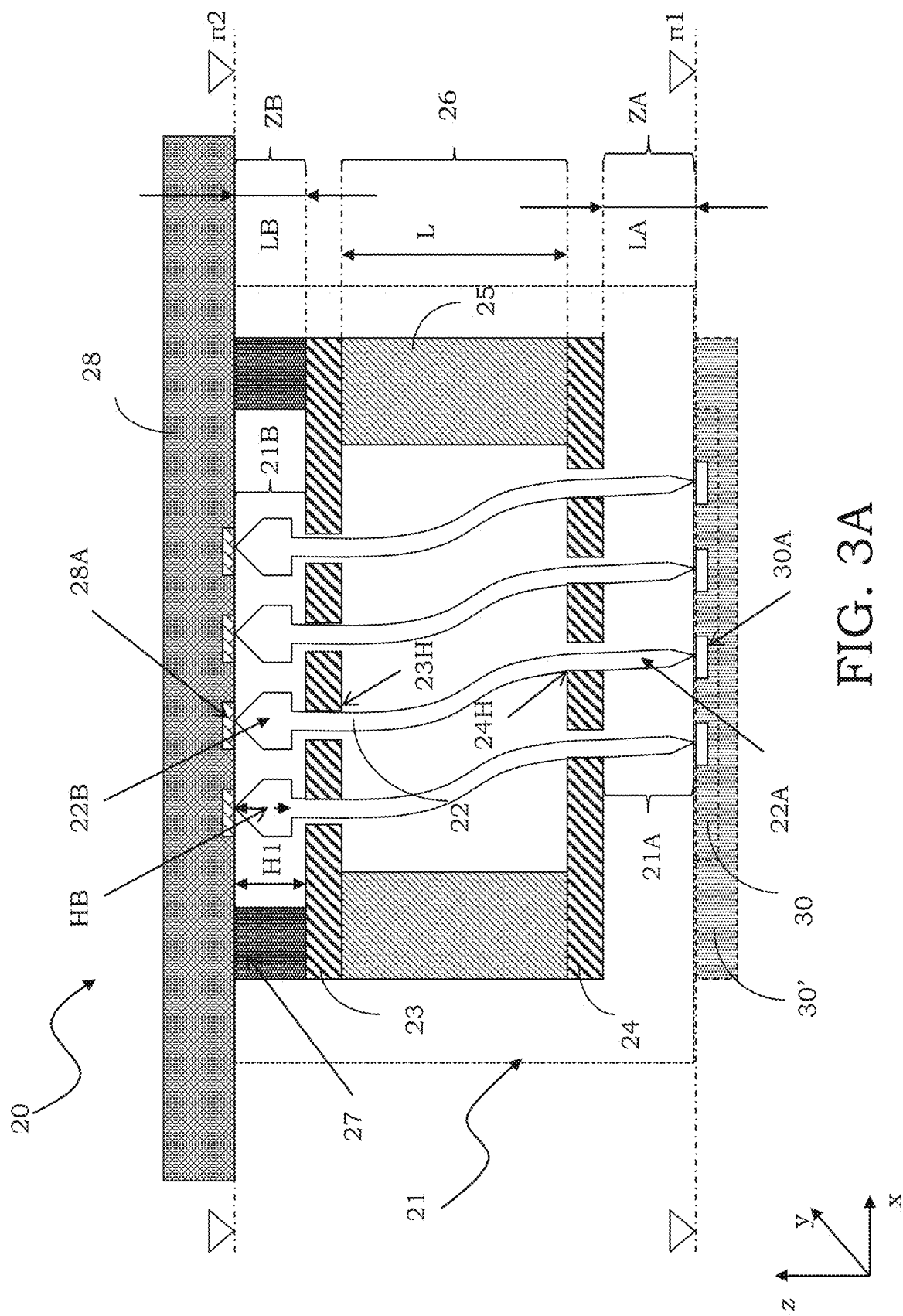
FIGS. 3A-3C, 4A-4C, 5A-5D, 6 and 7: schematically show in respective section views a probe card comprising alternative embodiments of the probe head of the disclosure.

FIG. 3A shows the probe head 21 mounted on a probe card 20, which also comprises a space transformer or generally a PCB 28 for connecting and interfacing with a test equipment (not illustrated). In particular, the PCB 28 comprises a plurality of contact pads 28A onto which the contact heads 22B of the contact probes 22 abut. The probe card 20 is adapted to abut with its probe head 21 onto a device to be tested 30, in particular integrated on a semiconductor wafer 30', and provided with a corresponding plurality of contact pads 30A onto which the contact tips 22A of the contact probes 22 abut.

As already indicated, during the testing operations carried out by the probe card 20, i.e. when the probe head 21 is in pressing contact onto the device to be tested 30 and onto the PCB 28, the contact probes 22 bend at the bending area 26, which extends between the upper guide 23 and the lower guide 24 and has a length L, corresponding to the height of the case 25.

The first terminal portion 21A of the contact probes 22 at the contact tip 22A extends in a first area ZA between the lower guide 24 and the device to be tested 30; in particular, the contact tip 22A protrudes of a suitable first length LA with respect to the lower guide 24 of the probe head 21, with reference to a plane π1 determined by the wafer 20' of the device to be tested 30 in pressing contact with said probe head 21, corresponding to the length of the first area ZA. Said first area ZA allows a movement of the contact tips 22A of the contact probes 22 on the contact pads 30A of the device to be tested 30 during the operation of the probe head 21 and of the probe card 20 which comprises it and is therefore indicated as scrub area ZA.

Likewise, the second terminal portion 21B of the contact probes 22 at the contact head 22B extends in a second area ZB between the upper guide 23 of the probe head 21 and the PCB 28; in particular, the contact head 21B protrudes of a suitable second length LB with respect to said upper guide 23, with reference to a plane π2 of the PCB 28 in pressing contact with the probe head 21, in a similar way to the device to be tested 30, corresponding to the length of the second area ZB. Said second area ZB allows a movement of the contact heads 22B of the contact probes 22 during the operation of the probe head 21 and of the probe card 20 which comprises it and is therefore indicated as the floating area ZB.

Substantially, FIG. 3A shows the probe head 21 in operating conditions, i.e. during a test phase of the device to be tested 30 integrated in the wafer 30', when the contact probes 22 contained therein each have the contact tip 22A in pressing contact with a contact pad 30A of said device to be tested 30 and the contact head 22B in pressing contact with a contact pad 28A of the PCB 28; in the example of the figure, the protection structure 27 is in turn in contact with the PCB 28.

It is pointed out that the protection structure 27 of the probe head 21 therefore allows the length LB of the floating area ZB to be kept constant, essentially acting as a spacer element between the contact heads 22B of the contact probes 22 and the PCB 28, so as to ensure a constant and correct contact with said PCB 28 and therefore with the test equipment of which the probe card 20 constitutes a terminal element, a contact made precisely by the contact heads 22B abutting onto the contact pads 28A of the PCB 28. Said protection structure 27 is also able to prevent contact probes 22, even without enlarged contact heads 22B, from interlocking in the upper guide holes 23H provided in the upper guide 23 and adapted to house them. Corresponding lower guide holes 24H are provided in the lower guide 24 to house the contact probes 22.

Figure 3B:
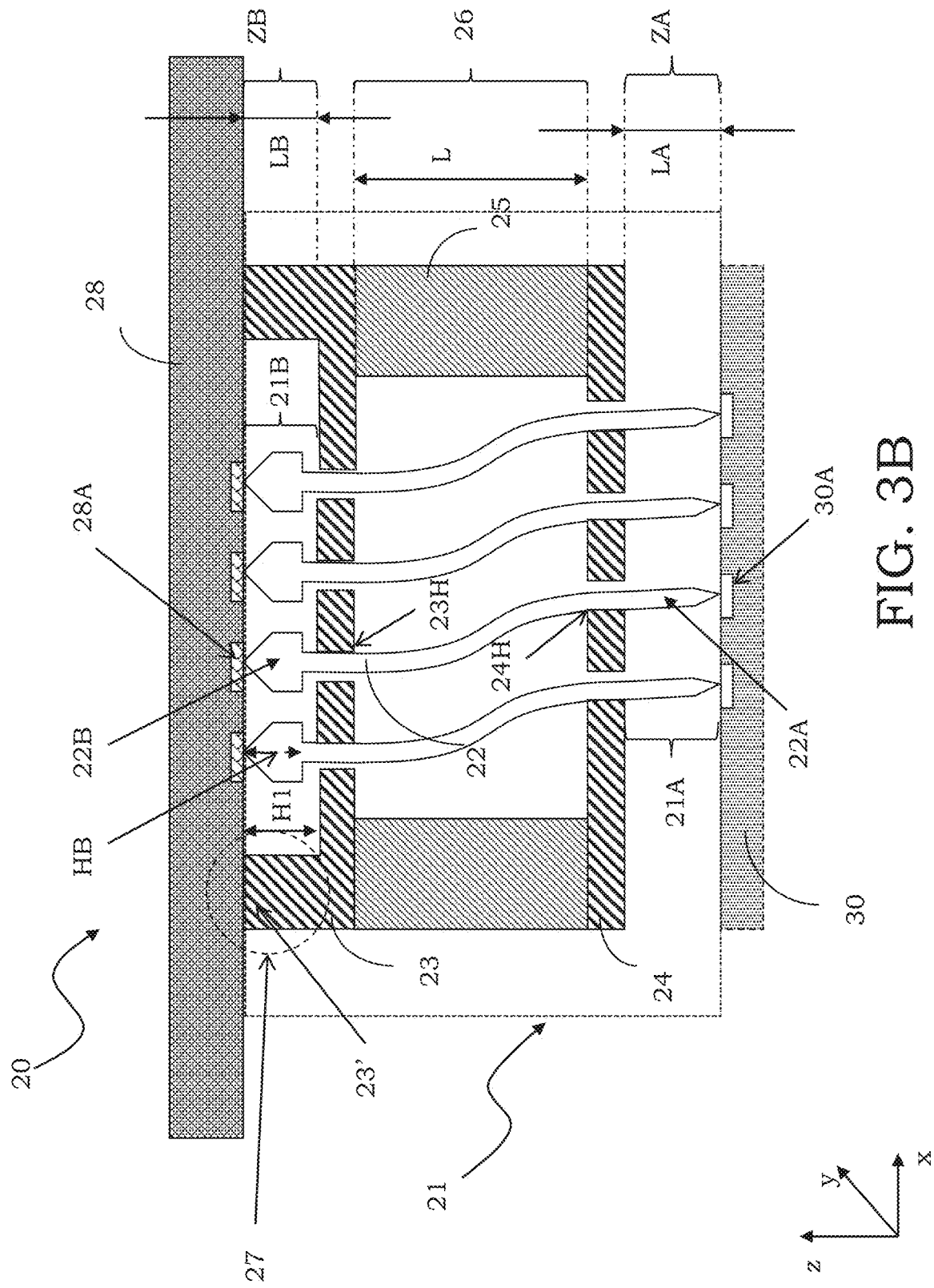

It is also possible to make the protection structure 27 by means of a suitable configuration of the upper guide 23, in particular by providing the same with projecting portions 23' in the direction of the PCB 28, said projecting portions 23' being able, for example, to be in the form of a frame or edge of the upper guide 23, extended outside an area of said upper guide 23 provided with the upper guide holes 23H and therefore adapted to house the contact probes 22 so as to guarantee the correct operation of the probe head 21 and of the probe card 20 which comprises it, as schematically illustrated in FIG. 3B. In this case, the protection structure 27 is made in one piece with the upper guide 23.

Figure 3C:
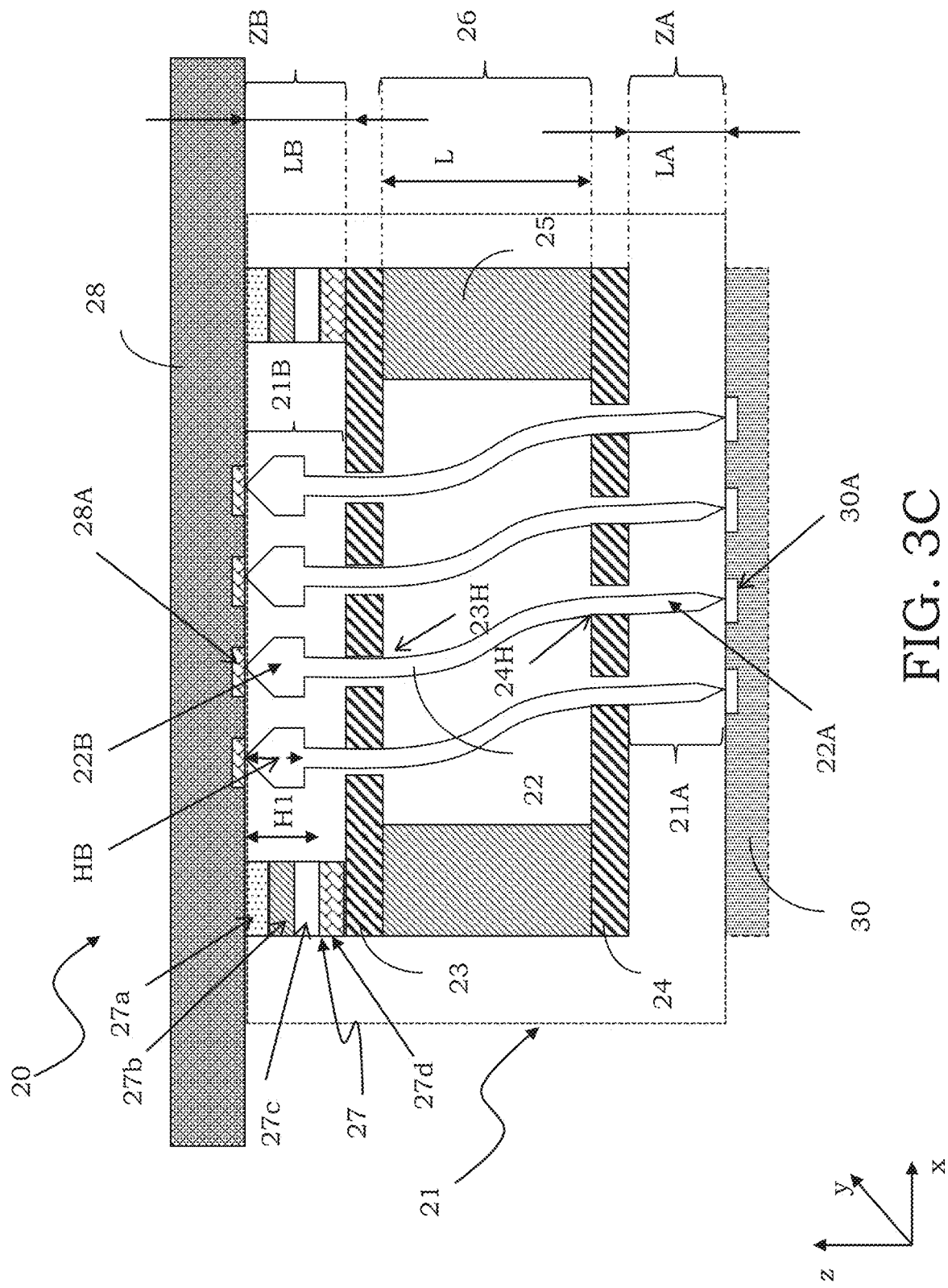

As illustrated in FIG. 3C, the protection structure 27 can also be made by means of a plurality of layers 27a, 27b, 27c, 27d, suitably stacked one upon another between the PCB 28 and the upper guide 23, individually detachable or peelable, so as to provide a protection structure 27 having a height H1 that can be modified. Said layers 27a, 27b, 27c, 27d are possibly made integral with each other by means of an adhesive material, such as a glue, with low seal, so as to easily allow the separation of the same from each other.

The protection structure 27 illustrated in FIG. 3C comprises four layers, by way of non-limiting example only, said structure being able to comprise any number of layers, possibly even just one, with equal or different thickness.

Such an embodiment proves to be particularly convenient. In fact, it is well known that the first terminal portion 21A reduces its length LA as the probe head 21 is used, by virtue of the passages of its contact tips 22A on the abrasive cloth, as explained above. Basically, the first terminal portion 21A wears out during each cleaning operation of the corresponding contact tip 22A, reducing the length LA of the scrub area ZA, until the probe head 21 can no longer work correctly.

Suitably according to the present embodiment, the protection structure 27 can be reduced in height by eliminating one or more layers 27a, 27b, 27c, 27d, which reduces the length LB of the floating area ZB, thus allowing a displacement towards the other of the assembly upper guide 23-lower guide 24-case 25, that is of the probe head 21, allowing the contact probes 22 housed therein to protrude more from the lower guide 24 and consequently increasing the length LA of the scrub area ZA.

The protection structure 27, in particular the number or height of its layers 27a, 27b, 27c, 27d is sized so as to have a height H1 that is sufficiently greater than the height HB of the contact head 22B, so as to be able to guarantee the correct containment of the contact heads 22B and in particular a sufficient length LB of the floating area ZB, even after the elimination of one or more of the layers 27a, 27b, 27c, 27d of the protection structure 27.

According to an alternative embodiment, not illustrated in the figures, the protection structure 27 comprises at least a fixed portion with a height equal or greater than the height HB of the contact heads 22B and a further portion with individually removable layers. In this way, it is ensured that the height H1 of the protection structure 27 is always greater than or equal to the height HB of the contact heads 22B even after the elimination of all the removable layers.

The protection structure 27 and layers 27a-27d thereof, if any, are made of transparent or semitransparent plastic material, or ceramic material, or metallic material or organic material or silicon, preferably of Kapton®. Furthermore, the layers can be made integral with each other, for example by means of a layer of adhesive material, preferably with low seal, or by means of further removable coupling means, such as screws or clips.

In the embodiment illustrated in FIG. 3C, again by way of example, the protection structure 27 and the individual layers thereof 27a-27d are made in the form of a frame. It is also possible to make the protection structure 27 in the form of pairs of half-frames, extended substantially along opposite and parallel sides of the probe head 21 and of the upper guide 23.

Although not illustrated in the figures, it is pointed out that the protection structure 27 and layers 27a-27d, if any, thereof can also be made so as to protrude with respect to the upper guide 23 and/or the PCB 28.

Figure 4A:
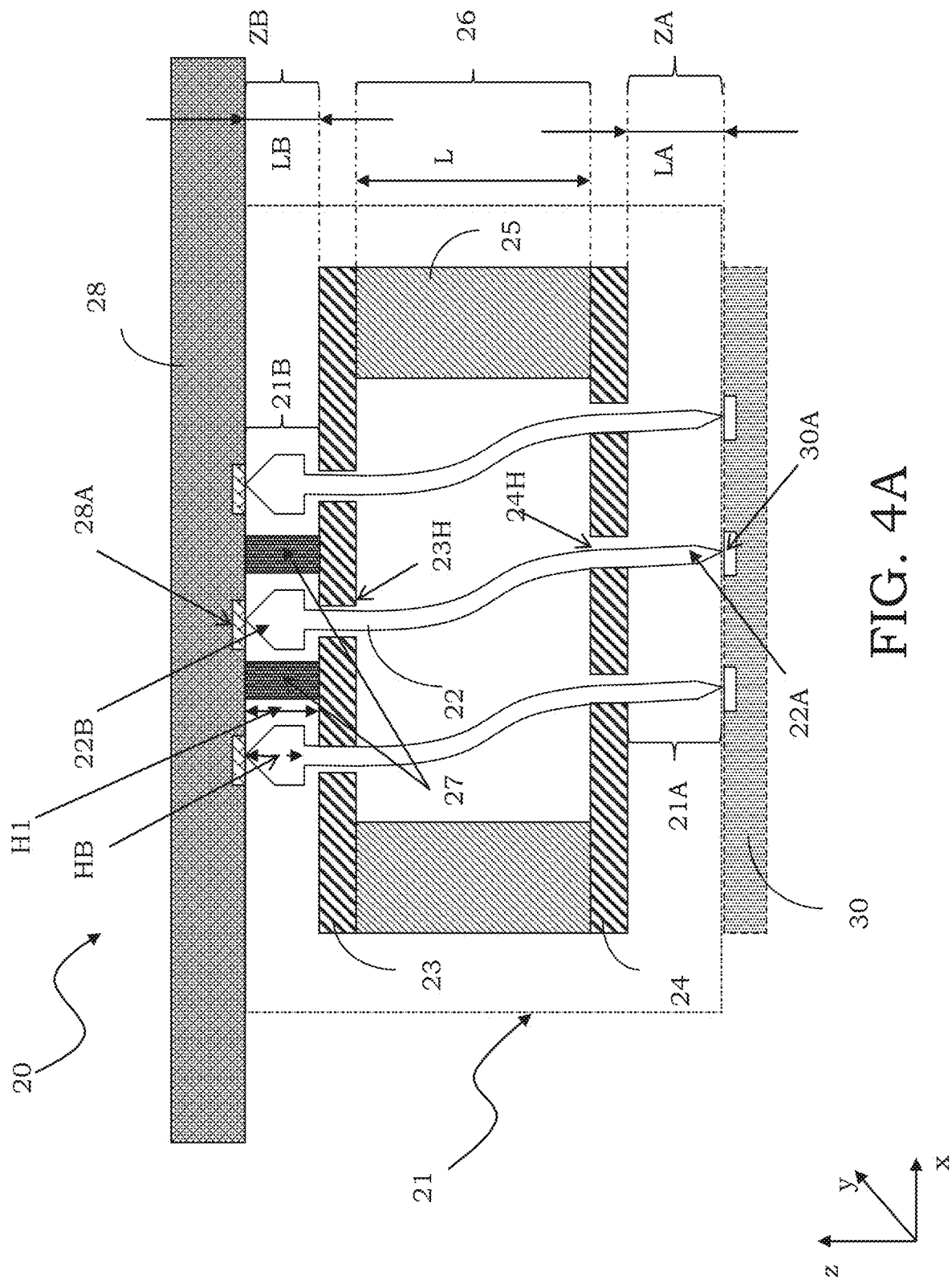

The protection structure 27 can also take on a totally different shape, such as for example one or more individual pillars positioned on the upper guide 23 also within the housing area of the contact probes 22, in areas without the corresponding upper guide holes 23H, as schematically illustrated in FIG. 4A. In the example of the figure, the protection structure 27 comprises a pair of pillars which extend between the upper guide 23 and the PCB 28 in areas not occupied by the contact probes 22.

Also in this case, the protection structure 27 projects from the upper guide 23 in the direction of the test equipment and is fastened to said guide in a more or less removable manner, for example by means of a layer of adhesive glue, by welding or by fastening means such as screws or clips which cross at least partially the protection structure 27 and the upper guide 23. Furthermore, like previously, the protection structure 27 has a height H1 equal to or preferably greater than a corresponding height HB (H1≥MB) corresponding to the overall volume of the contact heads 22B with their enlarged portions, always intended as the greatest among the heights of the individual contact heads 22B of the contact probes 22 housed in the probe head 21. Alternatively, the height H1 of the protection structure 27 is established in such a way as to avoid an interlocking of the contact head 22B in the corresponding upper guide holes 23H of the upper guide 23, in particular when an enlarged portion is not present.

Figure 4B:
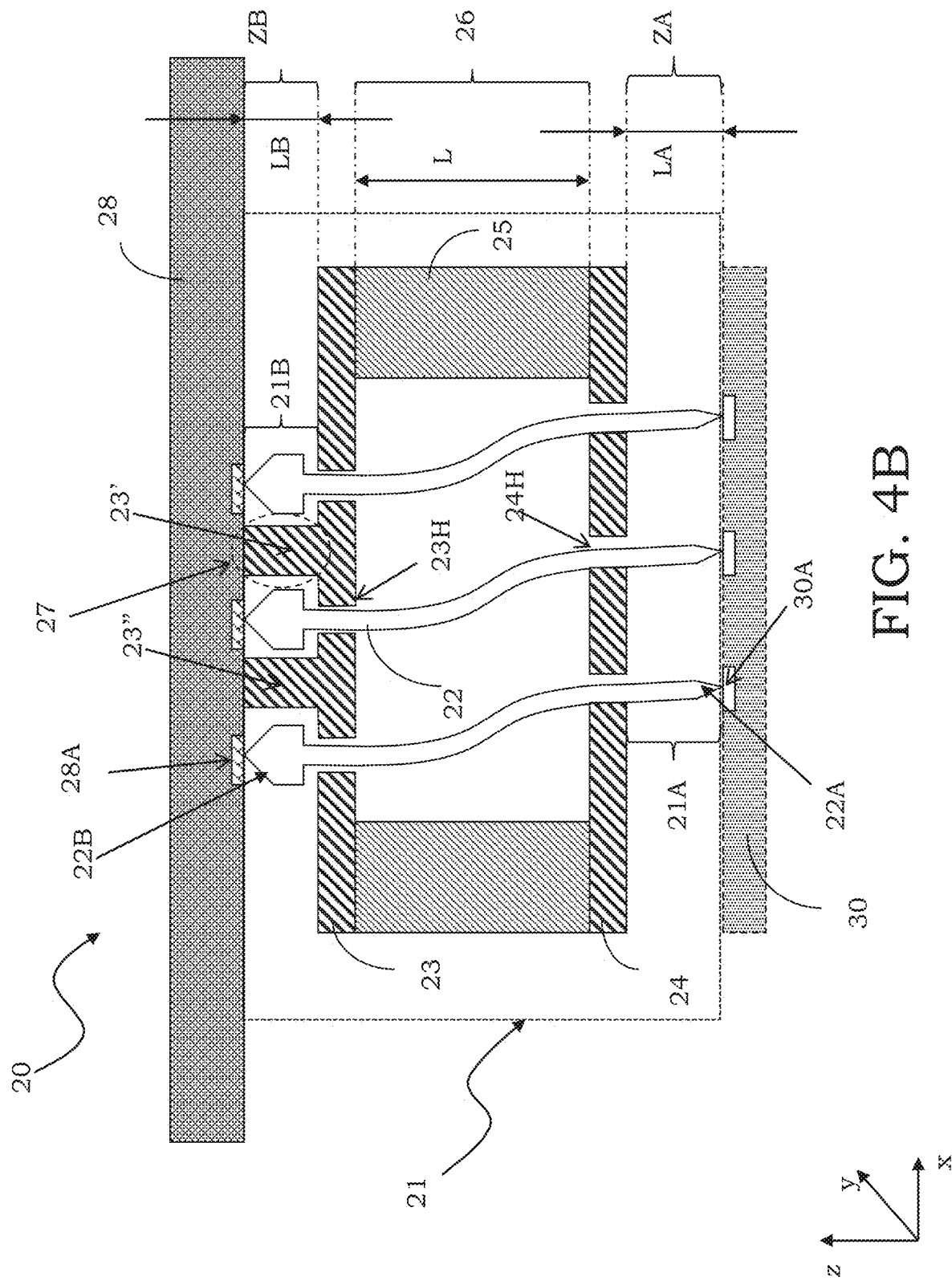
Figure 4C:
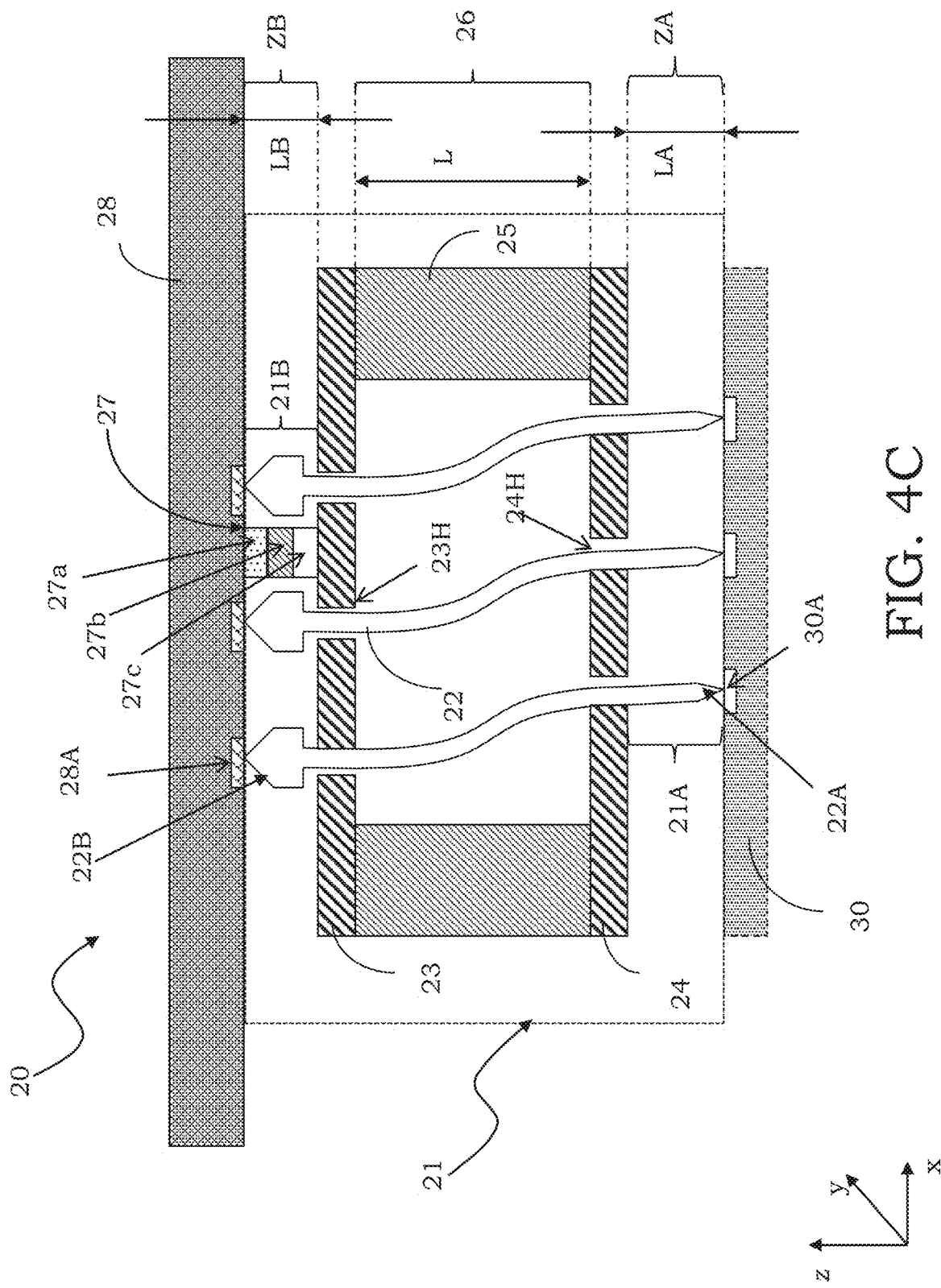

Like previously, it is also possible to make said protection structures 27 by means of a suitable configuration of the upper guide 23, in particular by providing it with projecting portions 23' in the direction of the PCB 28, as schematically illustrated in FIG. 4B, or by means of a plurality of individually detachable or peelable layers 27a, 27b, 27c, suitably stacked one upon another between the PCB 28 and the upper guide 23, as illustrated in FIG. 4C, where the protection structure 27 comprises a single pillar formed by three layers only by way of example.

It is also well known that in vertical probe heads of the "buckling beam" type, as illustrated in the figures, the contact probes 22 show significant problems of friction inside the respective guide holes, which can make the sliding of the probes inside them difficult or even prevent it.

The shortening of the first terminal portion 21A of the contact probes 22 due to the cleaning operations increases the chances of the probes getting interlocked in the corresponding lower guide holes; in a similar way, an approach of the upper guide 23 to the PCB 28 and therefore a decrease in the length LB of the floating area ZB increases the risk of the contact probes 22 of getting interlocked in the upper guide holes 23H, in particular when there are no enlarged contact head 22B.

Suitably it is possible to obtain a decrease in said sliding friction of the probes thanks to the use of a plurality of elementary supports, preferably two, parallel to each other to form at least one of the upper and/or lower guides of the probe head, as schematically illustrated in the FIGS. 5A-5D.

Figure 5A:
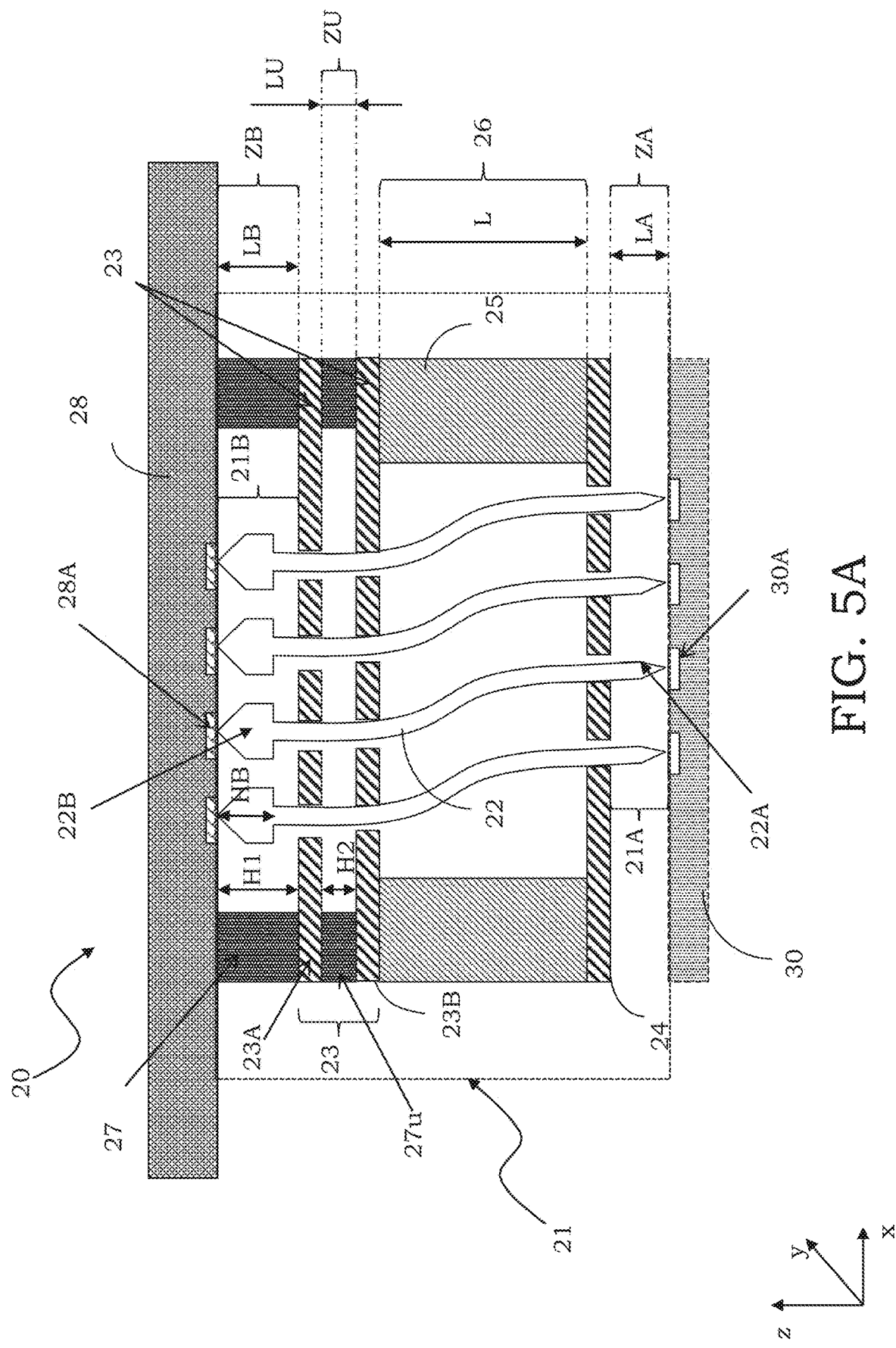

For example, as in the embodiment illustrated in FIG. 5A, the probe head 21 can comprise an upper guide 23 formed by a pair of elementary supports, an upper elementary support 23A and a lower elementary support 23B, that are plate-like and parallel, separated by at least one upper air area ZU having a length LU.

The probe head 21 also comprises in this case a protection structure 27 projecting from the upper guide 23, in particular from its upper elementary support 23A in the direction of the PCB 28, while the bending area 26, where the contact probes 22 may further deform, in case of the pressing contact of the probes onto the device to be tested 30, is defined between the lower elementary support 23B and the lower guide 24.

Suitably, the probe head 21 also comprises an upper spacer structure 27u with height H2 positioned between the elementary supports of the upper guide 23, thus ensuring that the distances between them and therefore the length LU of the upper air area ZU, as schematically illustrated in FIG. 5A, is maintained.

Figure 5B:
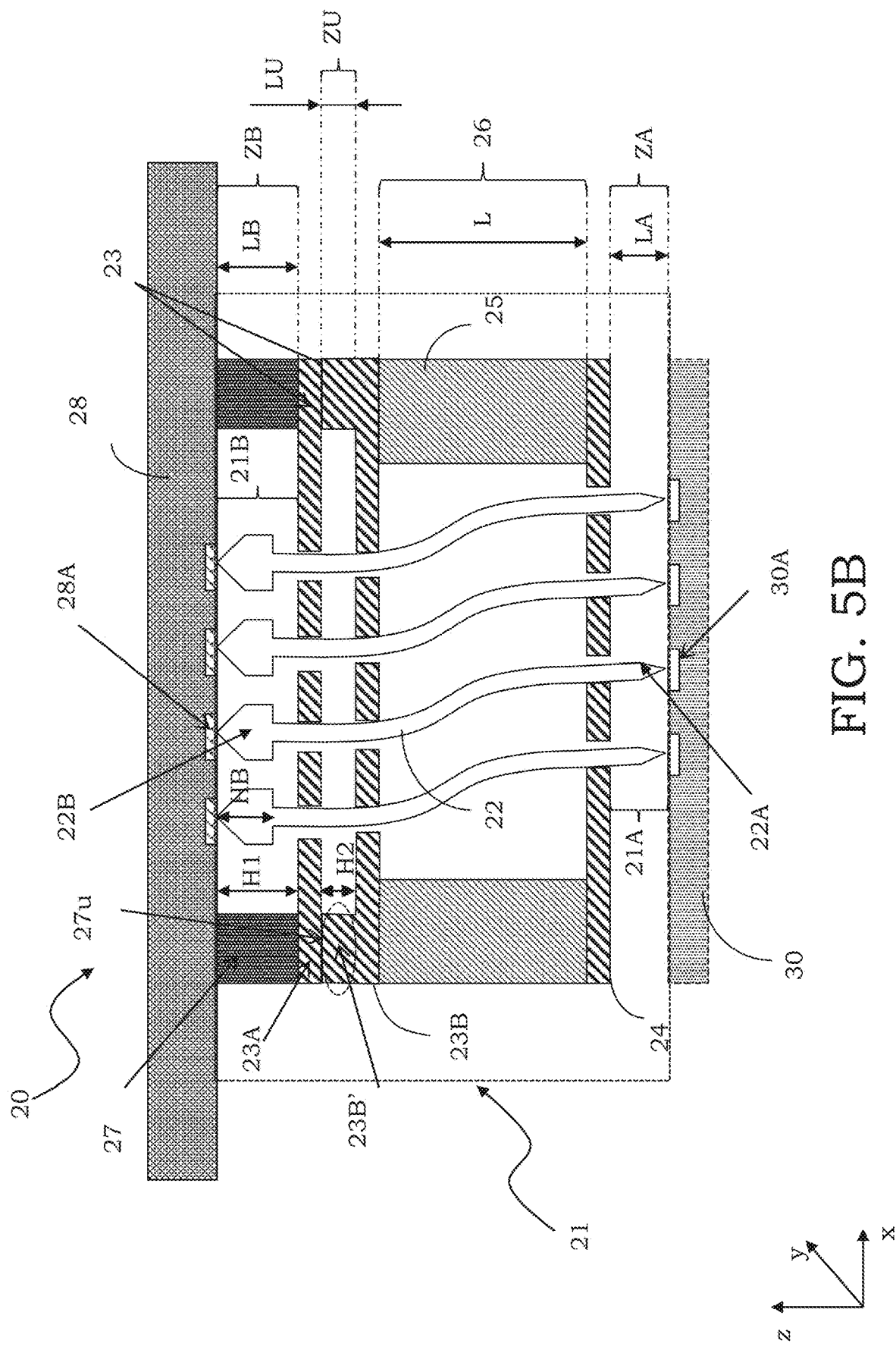
Figure 5C:
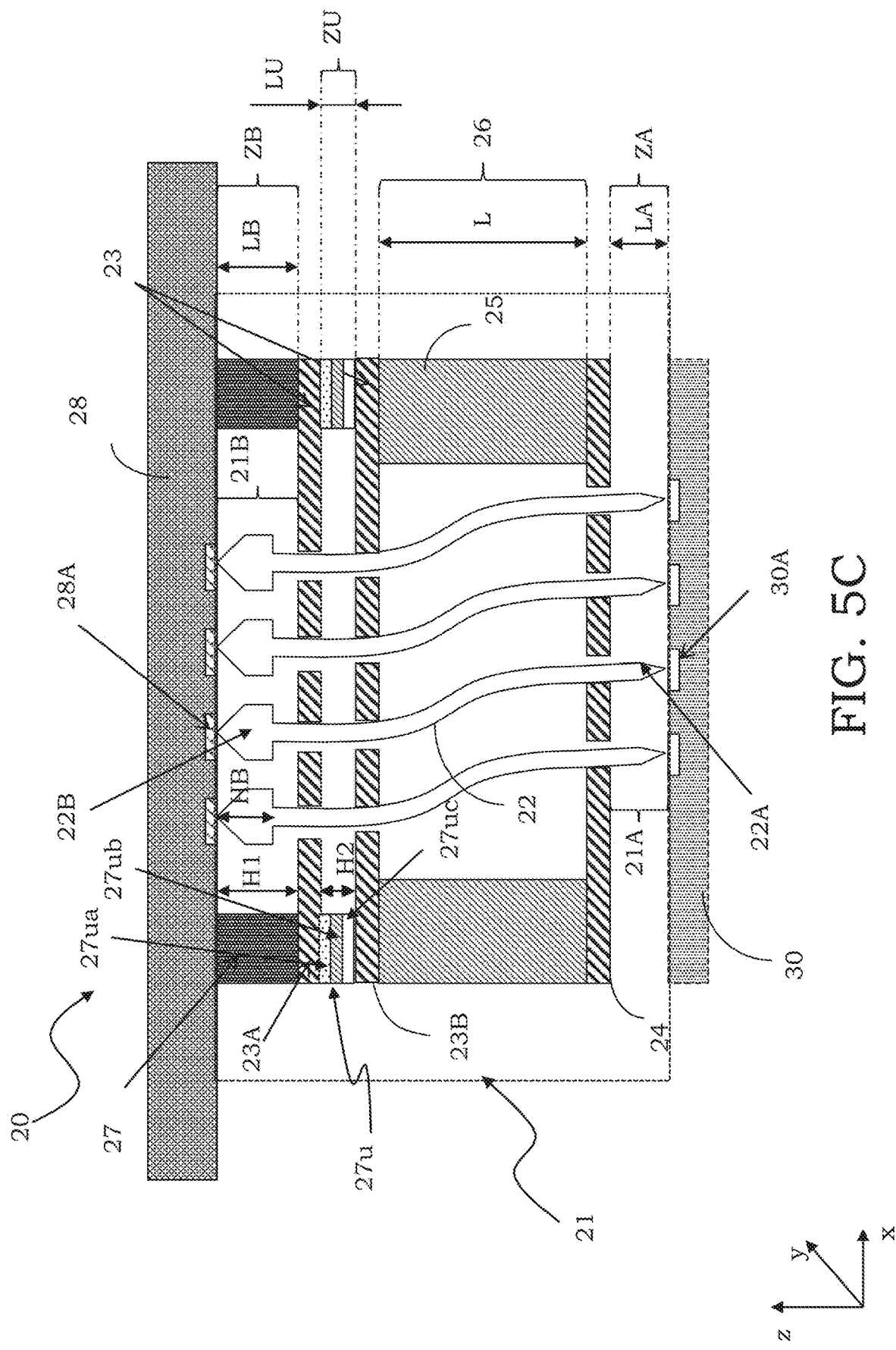

It is also possible to provide the upper spacer structure 27u by means of a suitable configuration of the lower elementary support 23B of the upper guide 23, in particular by providing it with projecting portions 23B' in the direction of the upper elementary support 23A and therefore of the PCB 28, as schematically illustrated in FIG. 5B, or by means of a plurality of individually detachable or peelable layers, suitably stacked one upon another between the upper elementary support 23A and the lower elementary support 23B, as illustrated in FIG. 5C, where the upper spacer structure 27u comprises three layers only by way of example and has a height such as to guarantee the desired length LU for the upper air area ZU.

Suitably, the upper spacer structure 27u made by means of a plurality of individually peelable layers can be used, as previously explained for the layered protection structure 27, to adjust the lengths of the floating area ZB and of the scrub area ZA, without modifying the length L of the bending area 26 defined between the lower elementary support 23B of the upper guide 23 and the lower guide 24.

Figure 5D:
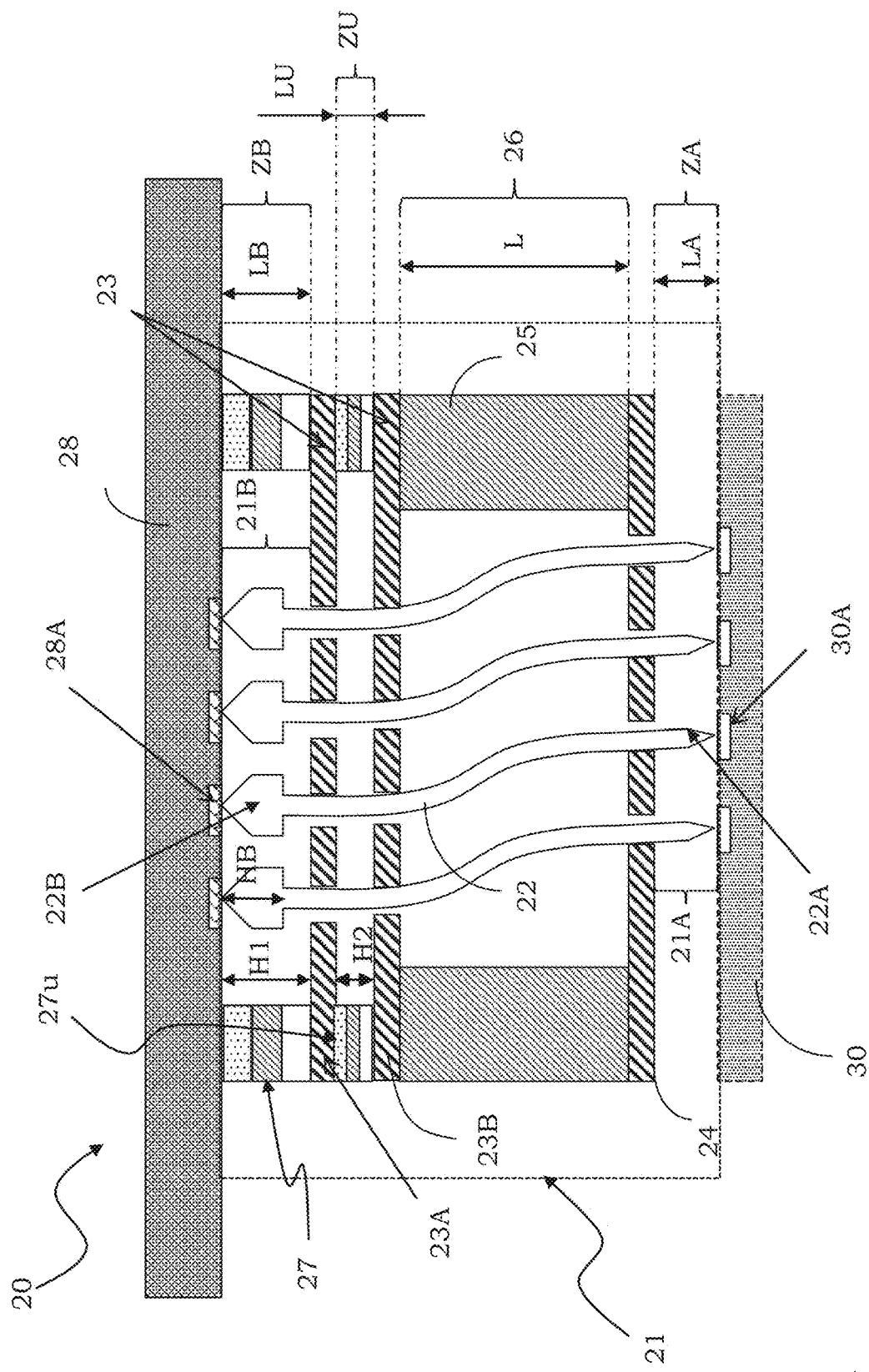

In a preferred embodiment, schematically illustrated in FIG. 5D, the probe head 21 can comprise both a protection structure 27 and an upper spacer structure 27u made by means of a plurality of individually and independently removable or peelable layers.

Figure 6:
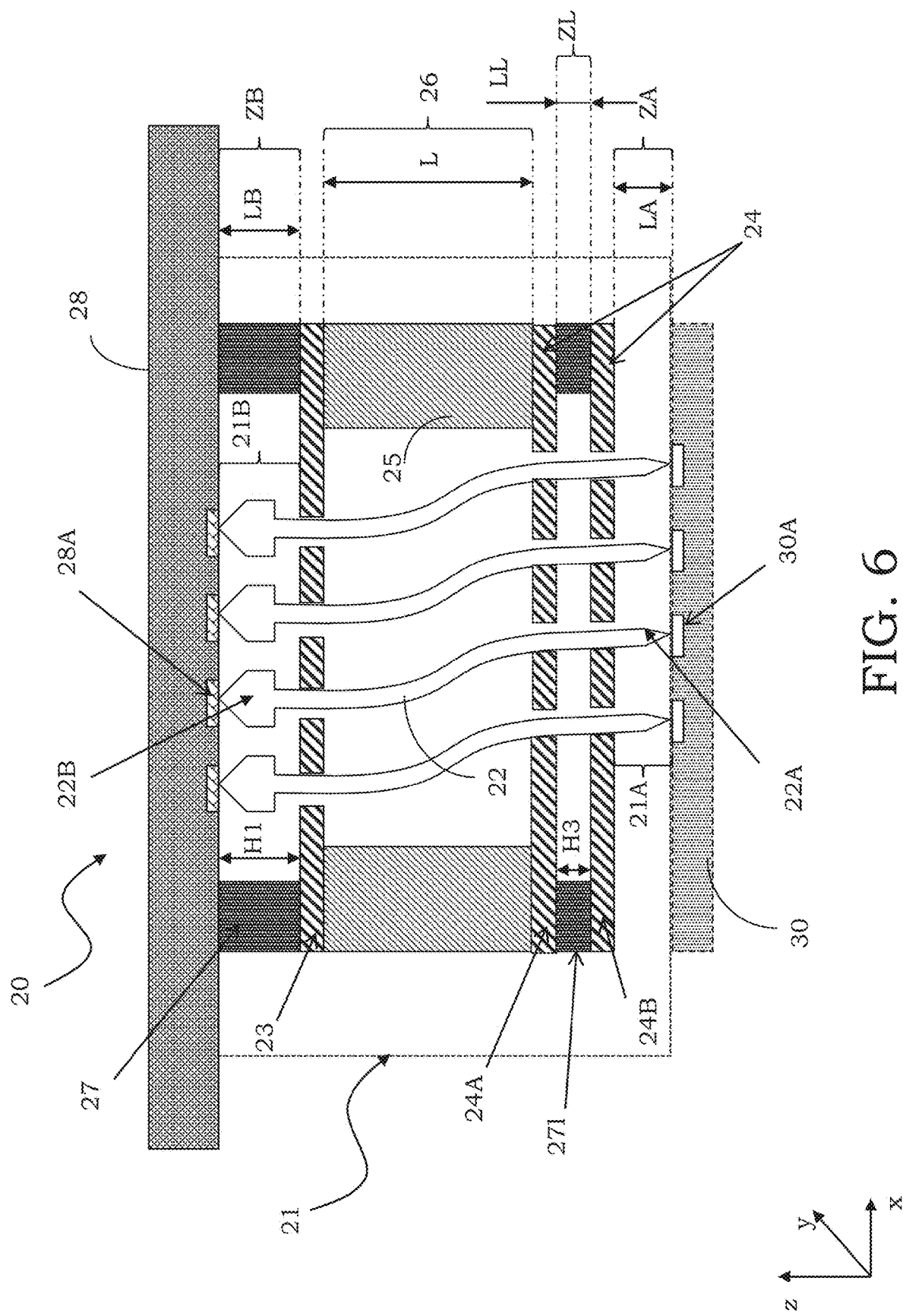
Figure 7:
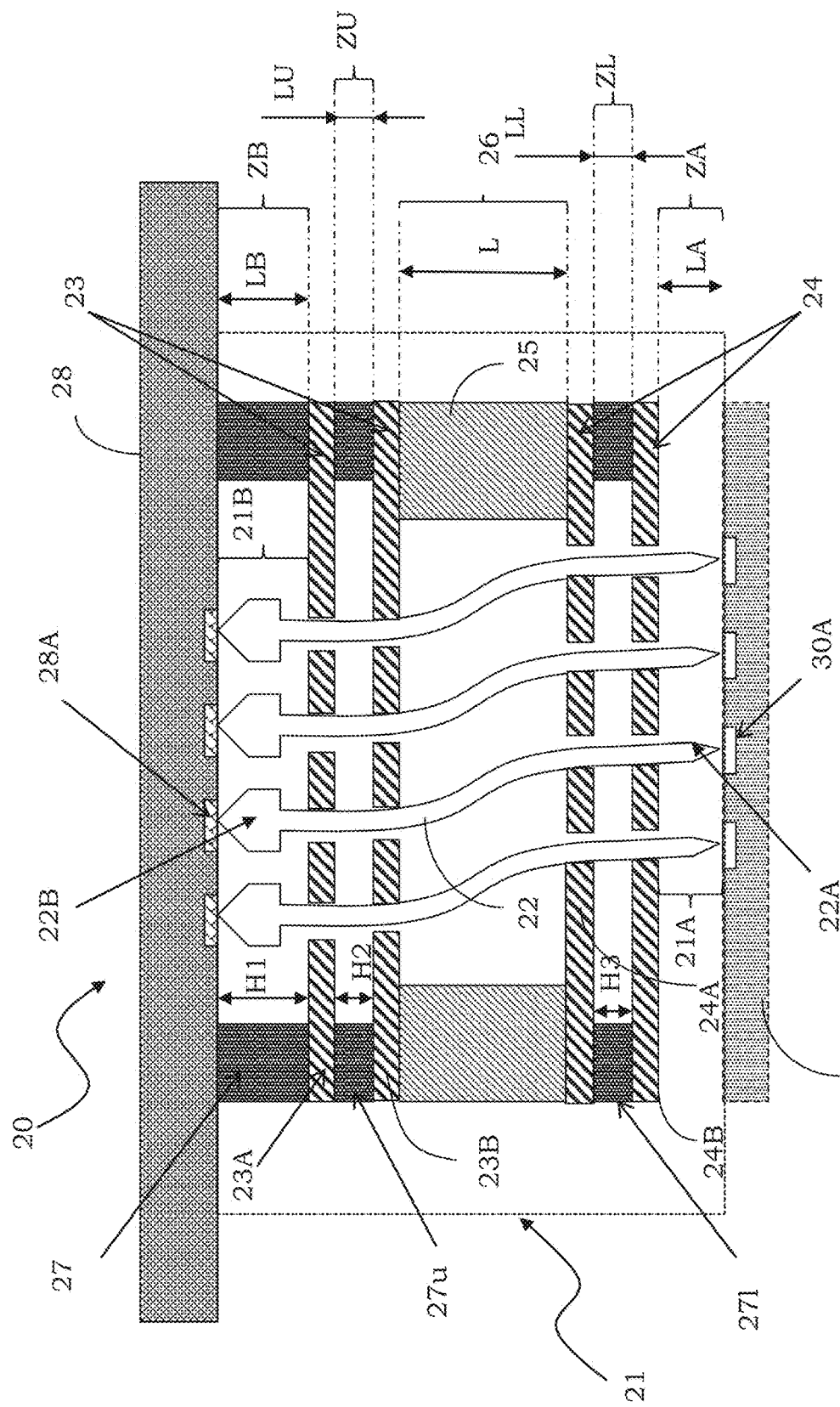

The considerations just made can also be applied if the lower guide 24 is formed by a pair of elementary supports, 24A and 24B, separated by a lower spacer structure 27l with height H3, which defines a lower air area ZL having a length LL, as schematically illustrated in FIG. 6, and in case both guides are, the probe head therefore comprising two pairs of elementary supports 23A, 23B and 24A, 24B and two spacer structures 27u and 27l with respective heights H2 and H3, in addition to a protection structure 27 of the contact heads 22B of the contact probes 22, as schematically illustrated in FIG. 7.

Also for said alternative embodiments, it is possible to provide one or more of the structures as described above, combining the solutions with each other according to the application needs of the probe head 21 and of the probe card 20 which comprises it.

It is pointed out that the different layers of the protection structures 27 and of the spacer structures 27u and/or 27l can be made so as to have portions protruding from the probe head 21, preferably with different lengths, so as to facilitate the correct removal thereof. Suitably, said protruding portions have equal lengths for corresponding layers of the different structures, for example the protruding portion of the layer that is the closest to the PCB 28 has the same minor length as the one of the subsequent layers, gradually closer to the guide or support positioned below said structure, considering the local reference of the figures. It is also possible to provide for a numbering for said layers, for example with numbering gradually increasing, said numbering being applied in the protruding portion of the layer so as to be visible and to make it possible to verify that all the structures comprise the desired number of layers simply by reading said numbering on all the protruding portions of the layers.

Asymmetrical removals of said layers can also allow to modify the relative distances between the supports and/or the guides, in particular causing an inclination of the same so as to compensate for any production or assembly inaccuracies of the supports and guides.

The probe card 20 also comprises respective holding means (not illustrated), adapted to integrate the various components of said board, in particular the elementary guides and/or supports, as well as the protection structures 27 and the spacer structures 27u and 27l, provided for said purpose with suitable housing seats for holding means. Said holding means can also be used to make the PCB 28, that is a space transformer, and the case 25 integral with each other.

It is pointed out that all the illustrated embodiments of the probe head and of the probe card according to the present disclosure allow an adjustment of the length of the terminal portion of the contact probes comprising the contact tips and therefore subject to consumption without modifying the length of the bending area of the probes themselves and therefore the movement dynamics of the same, in particular in terms of scrub as well as ensuring the constant maintenance of the floating area for the contact heads of the contact probes, so as to ensure a constant and correct contact with the PCB or the space transformer and therefore the test equipment, said floating area being maintained with a constant and unchanged length in case of the length of the contact tips of the contact probes being adjusted.

Furthermore, the presence of the protection structures allows to maintain a suitable distance between the upper guide and the PCB associated with the probe head, so as to guarantee the protection and correct holding of the contact probes and in particular of their contact heads possibly provided with enlarged portions.

In conclusion, the probe head according to the embodiments of the disclosure has a longer duration, since it is possible to provide for a large number of cleaning operations of the corresponding tip with a subsequent adjustment of the length of the terminal portions of the contact probes which protrude with respect to the lower guide so that it is equal to or greater than a length corresponding to a correct operation of the probe head, always ensuring the correct containment of the further terminal portions comprising the contact heads. In this way, the useful life of the probe card comprising such a head is also extended.

Suitably, the protection structure of said contact heads can be made in such a way as to extend over limited areas, even if severely limited, with respect to the extension of the guides, thus being positionable at will, both in number and position.

Furthermore, it is possible to make further adjustments to the length of the terminal portions of the contact probes at different times in the life of the probe head which includes them, in particular whenever said terminal portions comprising the contact tips have shortened due to use and cleaning and have a length smaller than a length corresponding to a correct operation of the probe head, also allowing to modify the length of the terminal portions in a different way for different contact probes in case of a misalignment of the respective contact tips due to the tolerances of the process for making the probes themselves.

Obviously, a person skilled in the art can make numerous modifications and variations to the probe head described above in order to satisfy contingent and specific needs, all included in the scope of protection of the disclosure as defined by the following claims.

In particular, it is obviously possible to consider geometric shapes other than those illustrated by way of example in the figures.

Furthermore, it is possible to provide the contact probes of the probe head according to the embodiments of the present disclosure with further measures, such as particular conformations for the tip portion, such as offsets or elongated portions, as well as for the body, like stoppers projecting therefrom.

Finally, the contact probes can be made by means of multilayer combinations of conductive, semiconductive or insulating materials, both in planar overlap and in concentric or coaxial manner; multilayer solutions are also possible in order to provide the guides and/or supports included in the probe head according to the embodiments of the present disclosure.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A probe head for a test equipment of electronic devices, able to test the devices provided with a plurality of contact pads by connecting them with corresponding contact pads of a board for connecting or interfacing with the test equipment, the probe head comprising:
    at least one upper guide and one lower guide, provided with respective guide holes;
    a plurality of contact probes developed along a longitudinal development axis and inserted in the guide holes of the upper guide and the lower guides; and
    a bending area for the contact probes defined between the upper guide and the lower guide;
    wherein each of the contact probes has:
        at least one first terminal portion which protrudes of a first length from the lower guide and ends with a contact tip adapted to abut onto a respective contact pad of the device to be tested; and
        a second terminal portion which protrudes of a second length from the upper guide and ends with a contact head adapted to abut onto a contact pad of the board for connecting or interfacing with said test equipment; and
    wherein the probe head further comprises at least one protection structure comprising projecting portions of the upper guide in direction of the longitudinal development axis of the contact probes towards said board and a plurality of individually detachable layers which are stacked one upon another between the projecting portions of the upper guide and the board; and
    wherein the protection structure is a spacer element between the contact heads of the contact probes and the board and is configured to keep a length of a floating area between the upper guide and the board and to avoid an excessive approach of the contact heads, the second terminal portion extending in the floating area.

2. The probe head according to claim 1, wherein the protection structure comprises an adhesive material or removable coupling means adapted to make the layers integral with each other.

3. The probe head according to claim 2, wherein the protection structure comprises a glue with low seal as adhesive material.

4. The probe head according to claim 1, wherein the protection structure has a shape selected from a frame, pairs of half-frames, single projecting elements such as pillars.

5. The probe head according to claim 1, wherein the protection structure and the plurality of individually detachable layers thereof are made of transparent or semitransparent plastic material, or ceramic material, or metallic material or organic material or silicon.

6. The probe head according to claim 1, wherein the protection structure has a height equal to or greater than one of the greatest among all heights of enlarged portions of the contact heads of the contact probes.

7. The probe head according to claim 1, wherein the protection structure has a height equal to or greater than one of the greatest among all heights of tapered portions of the contact heads of the contact probes.

8. A probe card for a test equipment of electronic devices, able to test the devices provided with a plurality of contact pads by connecting them with corresponding contact pads of a board for connecting or interfacing with the test equipment, comprising:
    at least one probe head comprising:
        at least one upper guide and one lower guide, provided with respective guide holes;
        a plurality of contact probes developed along a longitudinal development axis and inserted in the guide holes of the upper guide and the lower guide; and
        a bending area for the contact probes defined between the upper guide and the lower guide; and
    at least one board for connecting and interfacing with the test equipment;
    wherein each of the contact probes has:
        at least one first terminal portion which protrudes of a first length from the lower guide and ends with a contact tip adapted to abut onto a respective contact pad of the device to be tested, and
        a second terminal portion which protrudes of a second length from the upper guide and ends with a contact head adapted to abut onto a contact pad of the board for connecting or interfacing with said test equipment;
    wherein the probe head further comprises at least one protection structure comprising projecting portions of the upper guide in direction of the longitudinal development axis of the contact probes towards said board, and a plurality of individually detachable layers which are stacked one upon another between the projecting portions of the upper guide and the board; and
    wherein the protection structure is a spacer element between the contact heads of the contact probes and the board and is configured to keep a length of a floating area between the upper guide and the board and to avoid an excessive approach of the contact heads, the second terminal portion extending in the floating area.

9. The probe card according to claim 8, further comprising holding means adapted to make integral the guides of the probe head, the protection structure being provided with suitable housing seats for the holding means.

* * * * *